United States Patent
Chen

(10) Patent No.: US 6,219,244 B1
(45) Date of Patent: Apr. 17, 2001

(54) SECURING FIXTURE FOR A HEAT SINK FOR A CPU

(76) Inventor: Yang-Shiau Chen, 10F1., No. 406, Sec. 4 Jen Ai Rd., Taipei (TW)

( * ) Notice: Subject to any disclaimer, the term of this patent is extended or adjusted under 35 U.S.C. 154(b) by 0 days.

(21) Appl. No.: 09/536,160

(22) Filed: Mar. 28, 2000

(51) Int. Cl.[7] ............................................. H05K 7/20
(52) U.S. Cl. ...................... 361/704; 361/707; 361/710; 361/719; 165/80.3; 165/185; 174/16.3; 257/718; 257/719; 257/727
(58) Field of Search .................................. 361/704, 707, 361/709, 710, 719–721; 165/80.2, 80.3, 185; 174/16.3; 257/706, 707, 712, 713, 718, 719–722, 727

(56) References Cited

U.S. PATENT DOCUMENTS

| | | | |
|---|---|---|---|
| 5,283,467 | * | 2/1994 | Goeschel et al. .................. 257/718 |
| 5,365,654 | * | 11/1994 | Moulton ................................ 29/761 |
| 5,595,240 | * | 1/1997 | Daikoku et al. ..................... 361/699 |
| 5,653,672 | * | 8/1997 | Niinai et al. .......................... 494/14 |
| 5,912,804 | * | 6/1999 | Lawson et al. ...................... 361/704 |
| 6,055,159 | * | 4/2000 | Sun ...................................... 361/704 |

* cited by examiner

*Primary Examiner*—Leo P. Picard
*Assistant Examiner*—Boris L. Chervinsky
(74) *Attorney, Agent, or Firm*—Bacon & Thomas, PLLC

(57) ABSTRACT

A securing fixture for the heat sink on a PC board, being made from a winding wire to get the advantage of low cost and convenient mounting and detachment. The structural body of the securing fixture is formed by extending a movable rod section downwardly and then bending it to form an insertion end which is wider on the upper portion and is narrower on the lower end thereof, and then by extending upwardly to form an action rod section of which the top is wound toward the lower end to form a spring section. The movable rod section and the action rod section are enveloped in the spring section, while the insertion end is at the bottom of the spring section. The insertion end is provided on the top thereof with a limiting portion with a width larger than the inner diameter of an engaging hole of the PC board. Thus the insertion end is engaged beneath the engaging hole of the PC board, while the spring section is stopped above the engaging hole of the heat sink, hence the heat sink is fixed on the PC board by means of the securing fixture.

3 Claims, 9 Drawing Sheets

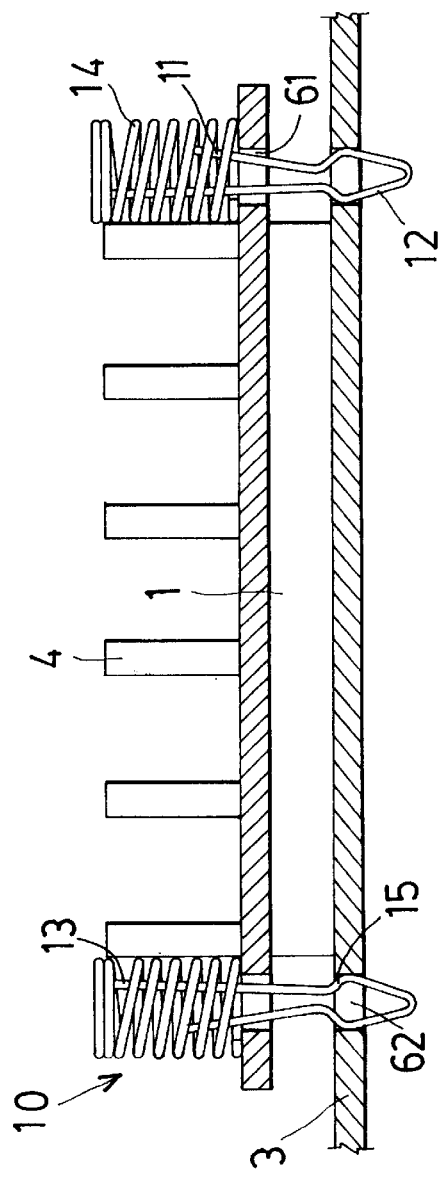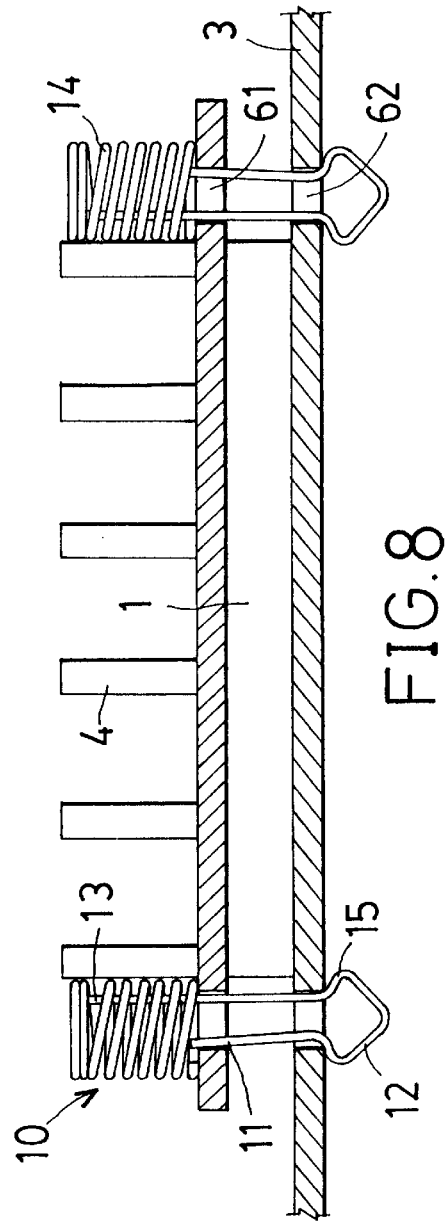

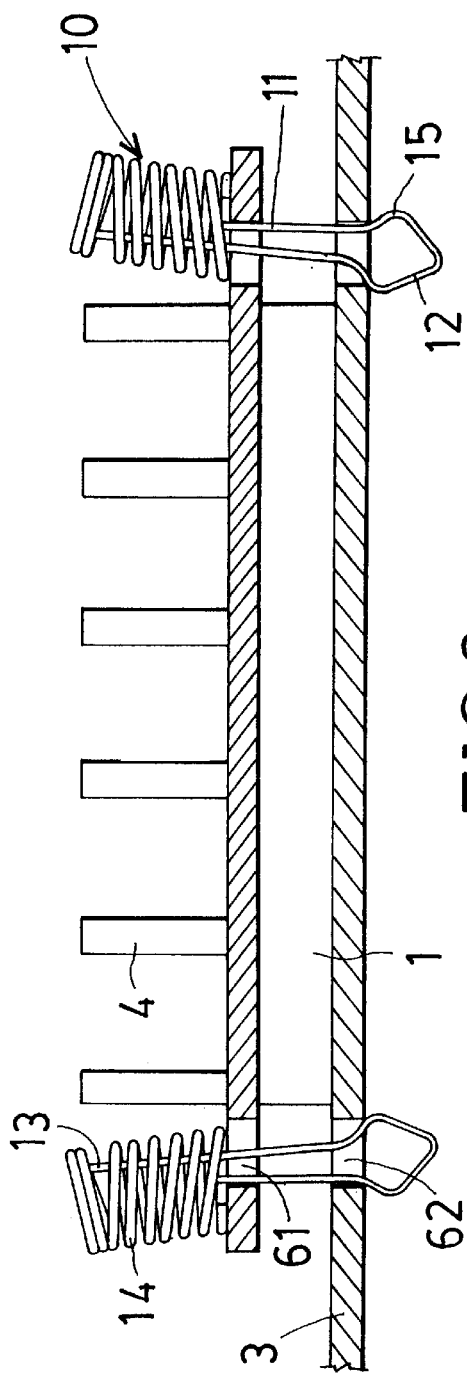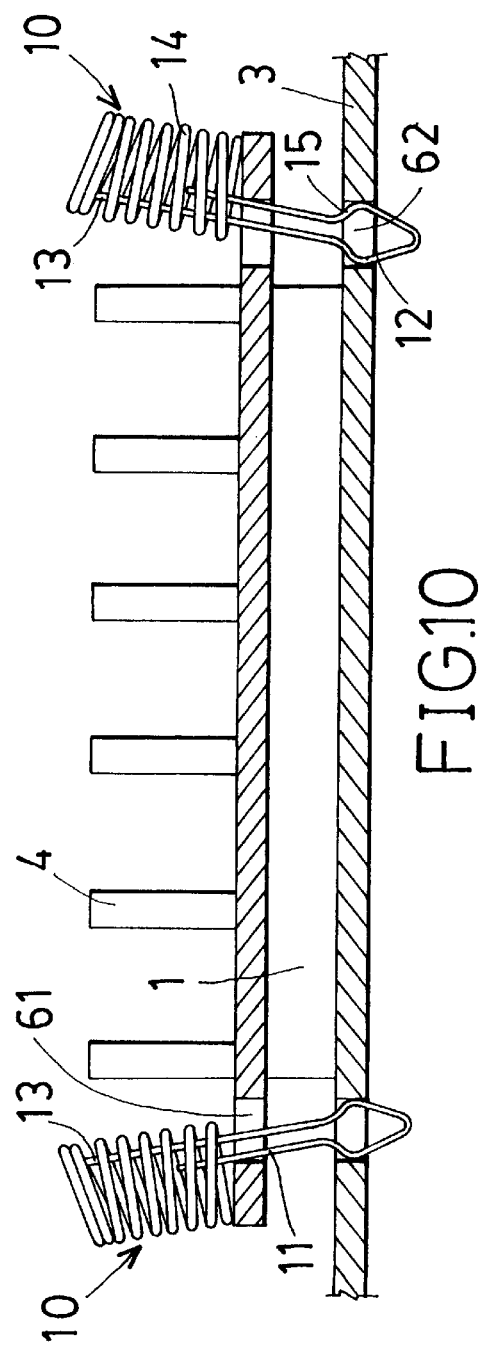

SECURING FIXTURE FOR A HEAT SINK FOR A CPU

BACKGROUND OF THE INVENTION

1. Field of the Invention

The present invention relates to a securing fixture for a heat sink, and especially relates to a securing fixture made from a metallic winding wire for the purpose of fixedly holding the heat sink on a PC board. With which, cost of production and effect of convenient detaching and mounting can be achieved.

2. Description of the Prior Art

CPU's of desktop computers 1 mostly, as the one shown in FIG. 1, are inserted each in a connector 2 (PGA base), and then the connector 2 is fixedly connected to a PC board 3. The CPU 1 will get high temperature during operation, the top of it is provided with a heat sink 4, so that heat generated from the CPU 1 will be absorbed by the heat sink 4 before heat sinking.

The heat sink 4 is superimposed on the CPU 1 which is inserted in the connector 2, and has a height difference from that of the PC board 3. Thereby, when the heat sink 4 is fixed on the CPU 1, it can be engaged and locked on an edge of the CPU 1 with an engaging member 5 extending downwardly from an edge of the heat sink 4, or can be engaged and locked on the connector 2, to complete fixing of the heat sink 4.

The structure of the engaging member 5 as shown in FIG. 1 is very simple, it can be integrally formed by injection molding in the way of mass production without further processing. Hence it has the advantage of low cost. However, such engaging member 5 can only be applied to the CPU 1 being inserted in the connector 2, and thereby has a height difference from the PC board 3; it cannot be applied to a CPU 1 being directly connected with the PC board 3.

As shown in FIG. 2, a notebook type computer is designed primarily on account of saving space, and has an object of being light, thin and convenient for carrying. Therefore, most elements thereof are surface mounting devices (SMD), i.c. the CPU 1 is fixed on the PC board 3 by the surface mounting technique (SMT) to save space.

The structure directly having the CPU 1 fixed on the PC board 3 does not have a gap for engagement of the engaging member stated above by virtue that the CPU 1 is laid parallelly on the PC board 3. So that when the heat sink 4 is fixed on the CPU 1, the PC board 3 and the heat sink 4 must be excavated to form mutual corresponding engaging holes 61, 62 respectively to be engaged with engaging members 7. And the heat sink 4 can be superimposed on the top of the CPU 1 and is fixed on the PC board 3.

The structure of each of the engaging members 7 is shown in FIGS. 2 and 3, and is provided on the top thereof with a head 71, a spring 72 is slipped over the shank of the engaging member 7 which has a bottom end in the shape of an arrow with an engaging end 73 having a diameter larger than that of the corresponding engaging hole 61 (62). The engaging end 73 has an opening to permit elastic contracting and stretching of the engaging end 73. When in use, the head 71 is pressed down to move down the engaging end 73. When the engaging end 73 is moved to abut on the engaging hole 61 of the heat sink 4, it can be extended through the engaging hole 61 by virtue that the opening of the engaging end 73 is contracted. When the engaging end 73 is extended through the engaging holes 61, 62 respectively of the heat sink 4 and the PC board 3, the engaging end 73 is clastically stretched out to engage beneath the engaging hole 62 of the PC board 3. In this way, the heat sink 4 superimposed on the top of the CPU 1 can be fixed on the PC board 3 by means of the engaging members 7. And the function of the springs 72 is to provide elastic action force to render the heat sink 4 tightly lapped over the top surface of the CPU 1 after the engaging members 7 are engaged onto the heat sink 4 and the PC board 3.

Each of the above stated engaging members 7 needs only a single pressing action to get its effect of convenient use when it is to be fixed on the heat sink 4, however, it still has the following defects:

1. When it is required to detach the heat sink 4, a pair of pincers are required to pinch the engaging end 73 for closing under the PC board 3 to reduce the diameter of the engaging end 73 and remove it. The bottom of the PC board 3 is in the lowest layer of the housing of the notebook type computer. Therefore, when it is required to detach the heat sink 4, the PC board 3 shall be detached firstly, this is troublesome and is a defect in detaching.

2. When in manufacturing the engaging members 7, a die shall be built, and plastic is used for molding, further, springs 72 are slipped over the engaging members 7. Cost for building a die is expensive, and slipping over of the springs is time and money consuming, these all increase the cost of production.

SUMMARY OF THE INVENTION

In view of these defects of the conventional engaging members in using and by cost, the inventor provides a securing fixture for the heat sink for a CPU after continuous study and improvement based upon his professional knowledge of manufacturing and practical experience of years in designing and manufacturing of the related products. The present invention can get rid of the defects resided in conventional techniques.

In particular, the securing fixture for the heat sink for a CPU of the present invention is integrally made from a metallic winding wire. The structural body thereof is formed by extending a movable rod section downwardly and then bending it to form an insertion end which is wider on the upper portion and is narrower on the lower end thereof, and then by extending upwardly to form an action rod section of which the top is wound toward the lower end to form a spring section. The movable rod section and the action rod section are enveloped in the spring section, while the insertion end is at the bottom of the spring section. The insertion end is provided on the top thereof with a limiting portion with a width larger than the inner diameter of the engaging hole of the PC board. The insertion end can be engaged beneath the engaging hole of the PC board, while the spring section is stopped above an engaging hole of the heat sink. In this way, the heat sink can be fixed on the PC board by means of a plurality of securing fixtures of the present invention.

The present invention is advantageous in that:

1. The securing fixtures are integrally made from winding metallic wires. It does not need to build an expensive die for manufacturing securing fixtures, nor the securing fixture needs additional processing, thereby the securing fixtures have the effect of saving cost.

2. In detachment, it needs only to slightly push a side of a securing fixture to contract the limiting portion on the top of the insertion end by the linking-up relationship among the action rod section, the movable rod section and the PC board to release the insertion end from the engaging hole of the PC board. Such detachment is very convenient, and when in slightly pushing a side of the securing fixture, if the direction of the pushing force is wrong, the detachment cannot be effected. Hence no dropping due to inadvertent wrong action will occur.

The present invention will be apparent in its particular structure and effects after reading the detailed description of the preferred embodiments thereof in reference to the accompanying drawings.

BRIEF DESCRIPTION OF THE DRAWINGS

FIG. 7 is a sectional side view showing a heat sink, a CPU and securing fixtures of the present invention during assembling;

FIG. 8 is a sectional side view showing a heat sink, a CPU and securing fixtures of the present invention when assembling thereof is completed;

FIG. 9 is a schematic sectional view showing detachment of the securing fixtures of the present invention;

FIG. 10 is another schematic sectional view showing detachment of the securing fixtures of the present invention;

DETAILED DESCRIPTION OF THE PREFERRED EMBODIMENT

Figure 1:
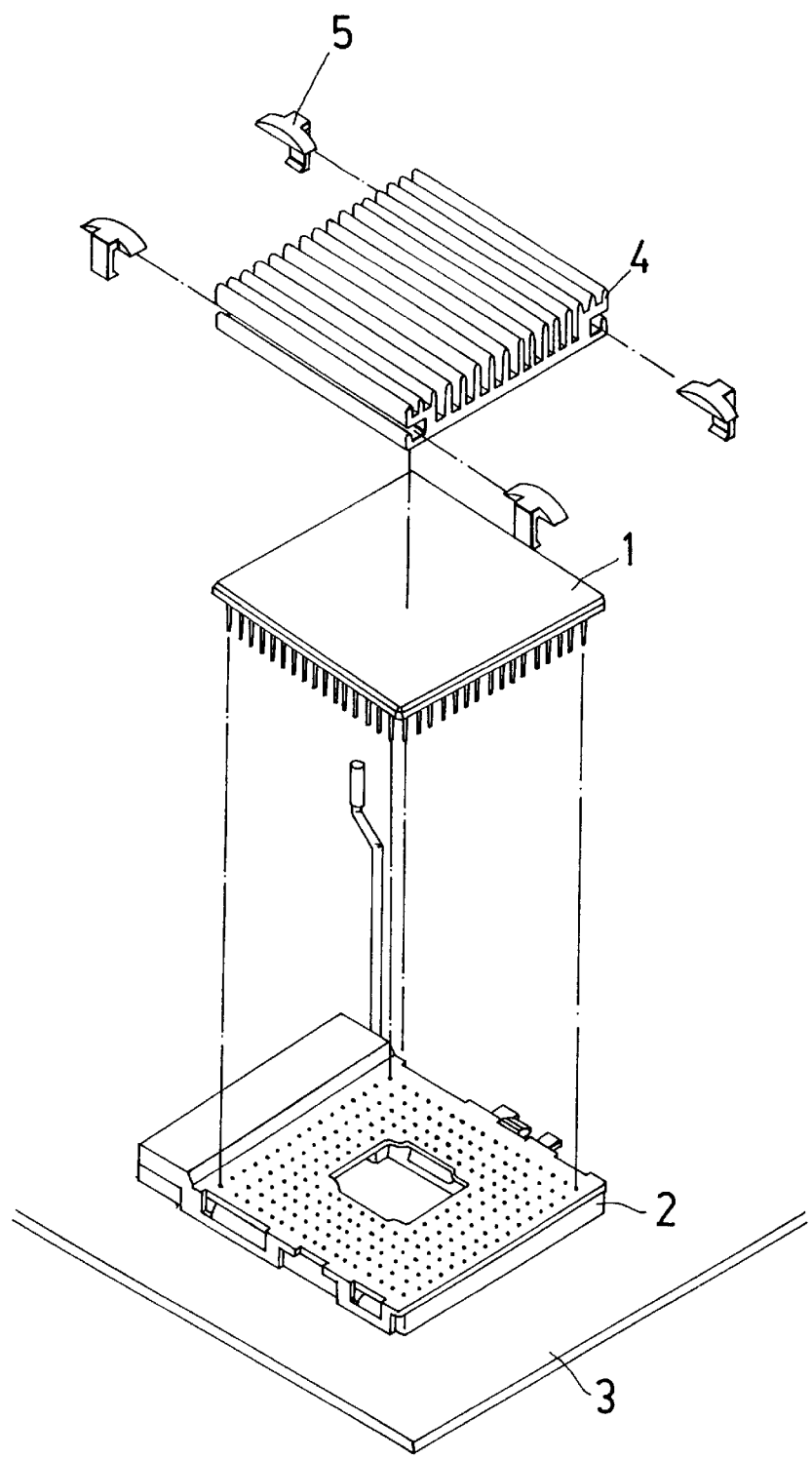
FIG. 1 is an analytic perspective view of a heat sink and a CPU combined with conventional engaging members.
Figure 2:
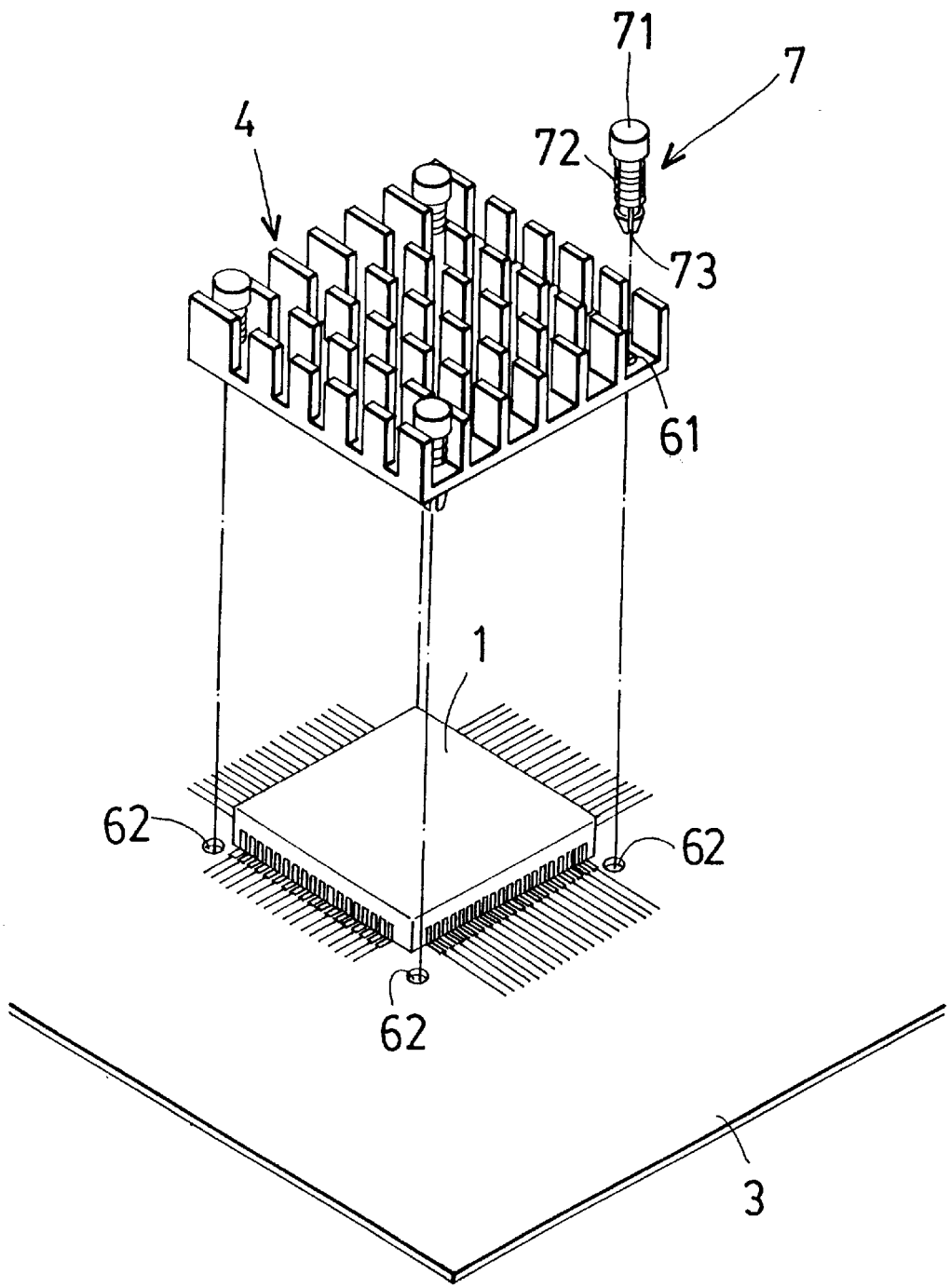
FIG. 2 is an analytic perspective view of a heat sink and a CPU combined with another kind of conventional engaging members.
Figure 3:
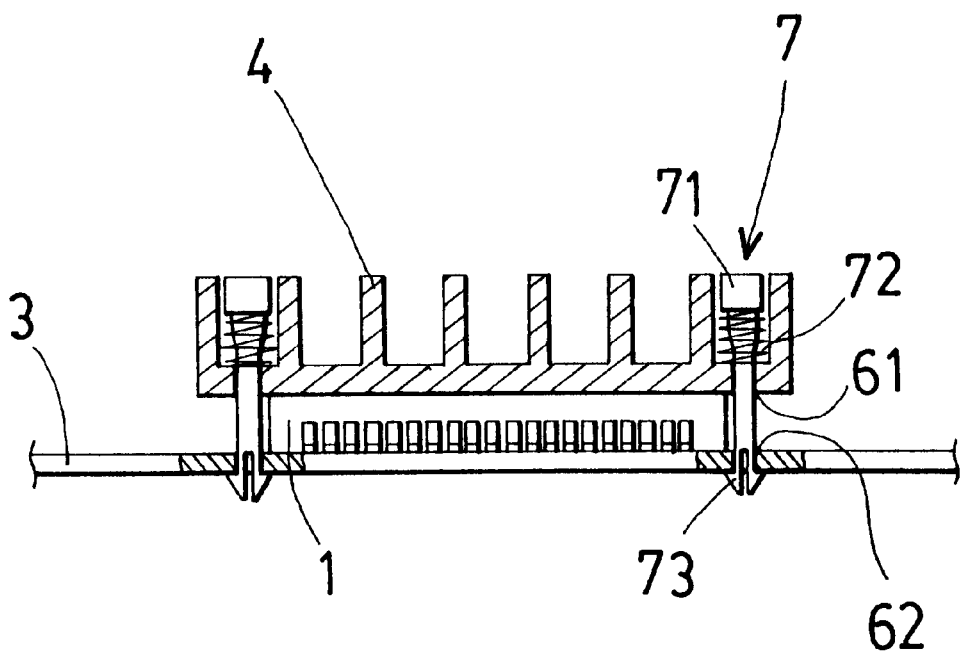
FIG. 3 is a sectional side view of a heat sink and a CPU combined with conventional engaging members.
Figure 4:
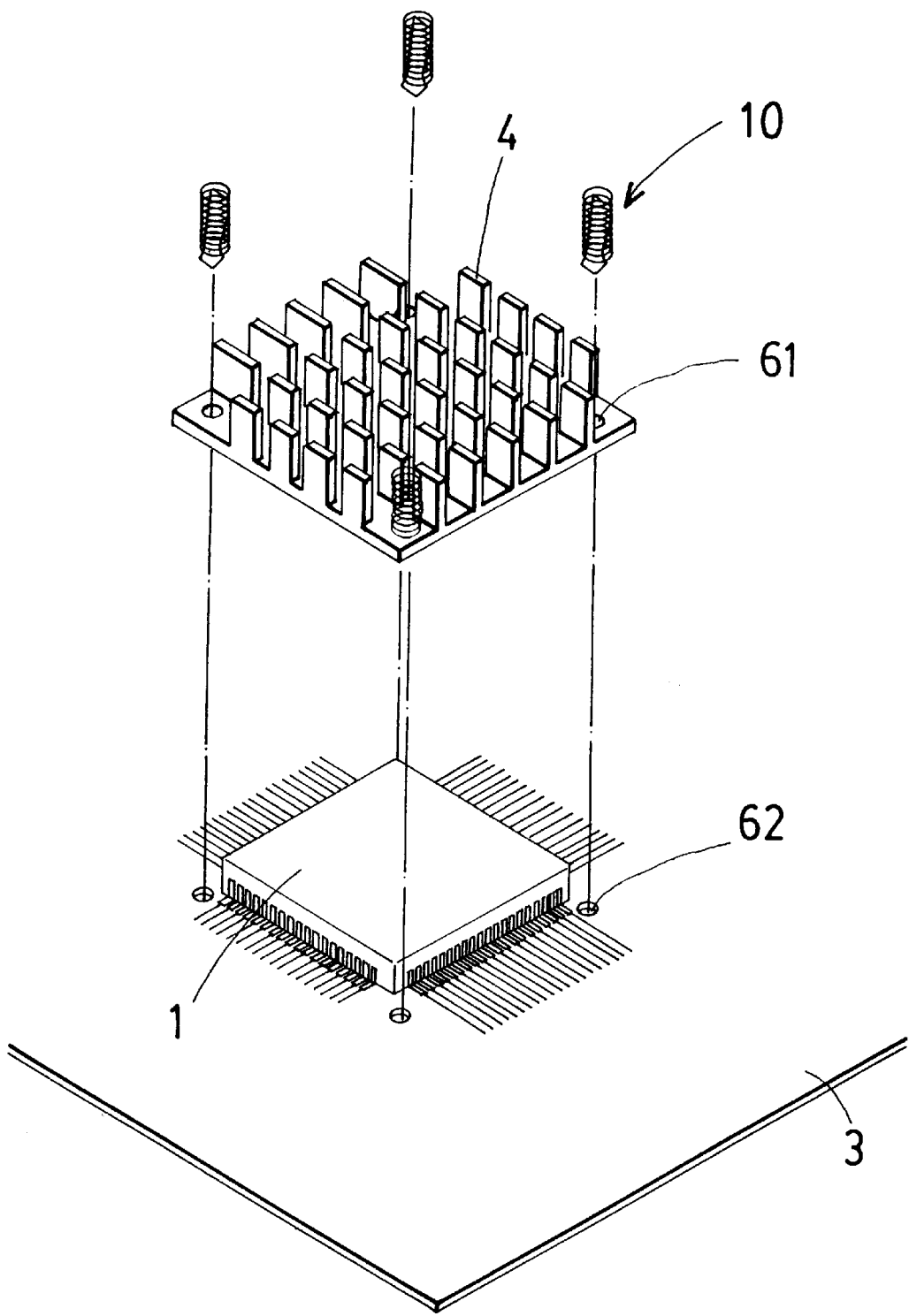
FIG. 4 is an analytic perspective view showing a heat sink and a CPU combined with securing fixtures of the present invention.
Figure 5:
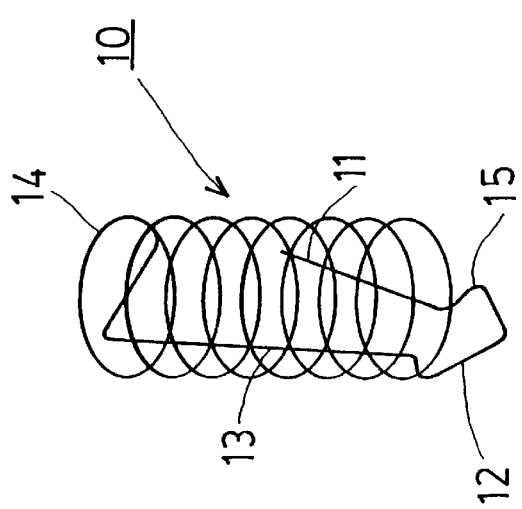
FIG. 5 is an enlarged perspective view showing a securing fixture of the present invention.

Referring to FIGS. 4 and 5, a securing fixture 10 of the present invention for a heat sink 4 and a CPU 1 is integrally made from a metallic winding wire. The structural body thereof is formed by extending a movable rod section 11 downwardly and then bending it to form an insertion end 12 which is wider on the upper portion and is narrower on the lower end thereof, and then by extending upwardly to form an action rod section 13 of which the top is wound toward the lower end to form a spring section 14. The movable rod section 11 and the action rod section 13 are enveloped in the spring section, while the insertion end 12 is at the bottom of the spring section 14. The insertion end 12 is provided on the top thereof with a limiting portion 15 with a width larger than the inner diameter of an engaging hole 61 of the heat sink 4 and an engaging hole 62 the PC board 3. The insertion end 12 can be engaged beneath the engaging hole 62 of the PC board 3, while the external diameter of the spring section 14 is larger than the inner diameter of the engaging hole 61 of the heat sink 4, and the spring section 14 is stopped above the engaging hole 61 of the heat sink 4. In this way, the heat sink 4 can be fixed on the PC board 3 by means of a plurality of securing fixtures 10 of the present invention made from a plurality of metallic wires.

Figure 6:
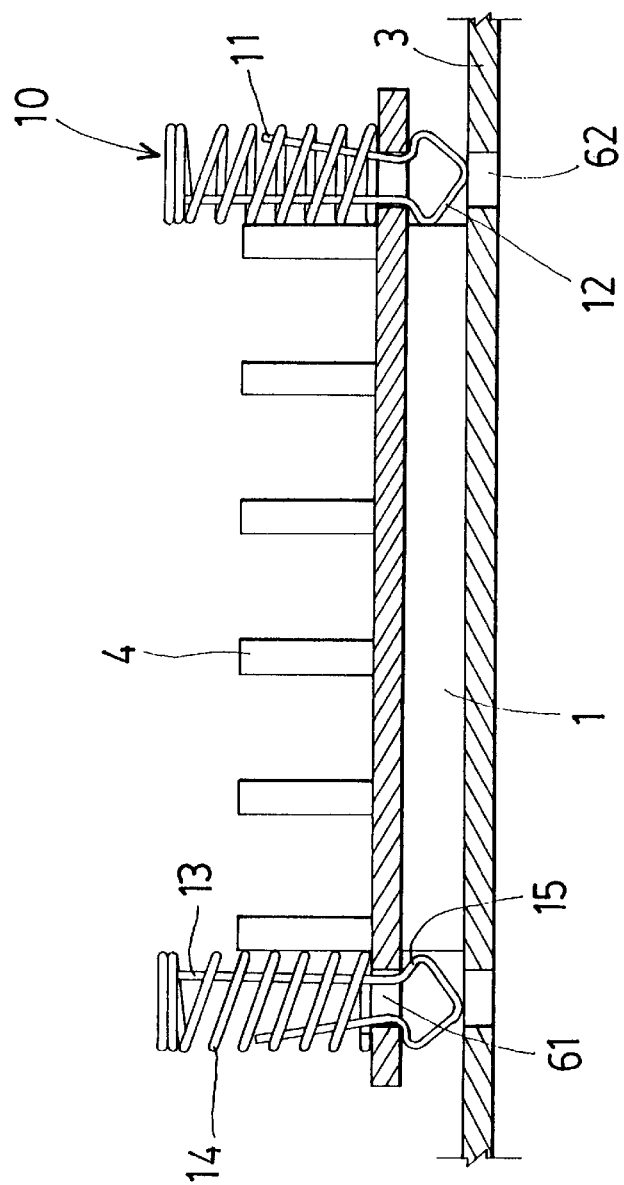
FIG. 6 is a sectional side view showing a heat sink and a CPU combined with securing fixtures of the present invention.

Referring FIG. 6, the securing fixtures 10 of the present invention on at heat sink 4 and a CPU 1 is mounted in the engaging holes 61, by virtue that widths of the limiting portions 15 are larger than that of the inner diameters of the engaging holes 61 of the heat sink 4, when the limiting portions 15 are beneath the corresponding engaging holes 61 of the heat sink 4 while the spring sections 14 are above the engaging holes 61 of the heat sink 4, the securing fixtures 10 do not drop. At this time, the heat sink 4 is superimposed on the top of the CPU 1, and the engaging holes 61 of the heat sink 4 are aligned with their corresponding engaging holes 62 of the PC board 3. The insertion ends 12 can be engaged beneath the engaging holes 62 of the PC board 3 by pressing the tops of the securing fixtures 10, thus fixing of the heat sink 4 is completed.

Referring to FIG. 7, by virtue that the abovementioned metallic wires arc extended straight upwardly from the insertion ends 12 to form action rod sections 13 and the tops thereof are then wound downward to form spring sections 14, thereby when the top of each securing fixture 10 is pressed down, force is directly exerted on the top of its action rod section 13 to move its insertion end 12 downward and compress its spring section 14 simultaneously. When the insertion end 12 is moved downward to have the lateral sides of a limiting portion 15 abutted on an engaging hole 62 of the PC board 3, the lateral side of the insertion end 12 is the aforesaid movable rod section 11 which can be displaced now toward the action rod section 13, while the limiting portion 15 of the insertion end 12 is contracted. Thereby, the limiting portion 15 can be extended through the engaging hole 62 of the PC board 3.

As shown in FIG. 8, by virtue that the insertion end 12 is an extension of the bended winding metallic wire, it is provided with elasticity. So that when the limiting portion 15 is extended through the engaging hole 62 of the PC board 3, the insertion end 12 is elastically stretched outward to move back to its original position. Now the limiting portion 15 recovers its state of being with a width larger than that of the inner diameter of the engaging hole 62, so that the insertion end 12 is held below the engaging hole 62 of the PC board 3. Besides, the external diameter of the spring section 14 of the securing fixture is larger than the inner diameter of an engaging hole 61 of the heat sink 4, thus the spring section 14 is stopped above the engaging holes 61 and is compressed and is endued with elastic restoring force. When the insertion end 12 is held below the engaging hole 62 of the PC board 3, the spring section 14 maintains an action force to down press the heat sink 4. So that the heat sink 4 is tightly compressed above the CPU 1, and engagement of the securing fixture 10 is completed. In other words, when it is desired to use the securing fixture 10 of the present invention to render the heat sink 4 superimposed on the CPU 1, it can be done only by a pressing action. By all means, the case is same when the securing fixtures 10 are to be mounted in the engaging holes 61 of the heat sink 4 as is shown in FIG. 6, and no further description is required for this herewith.

As shown in FIG. 9, when in detaching the securing fixture 10 of the present invention, force is exerted lightly sideways from the action rod section 13 toward the movable rod section 11. At this time, the outer sides of the movable rod section 11 is abutted on the inner edge of the engaging hole 62; so that when the action rod section 13 is moved toward the movable rod section 11, the limiting portion 15 of the insertion end 12 is contracted by compressing to slightly make the insertion end 12 tilted.

It has to be explained here that, if the direction of force is not exerted according to the above stated way, for example, the force is exerted lightly sideways from the movable rod section 11 toward the action rod section 13, by the fact that the movable rod section 11 does not connect directly with the spring section 14, the movable rod section 11 is unable to move toward the action rod section 13. Therefore, the limiting portion 15 of the insertion end 12 is unable to be contracted by compressing, and there is not the case to form the state as shown in FIG. 9.

Figure 11:
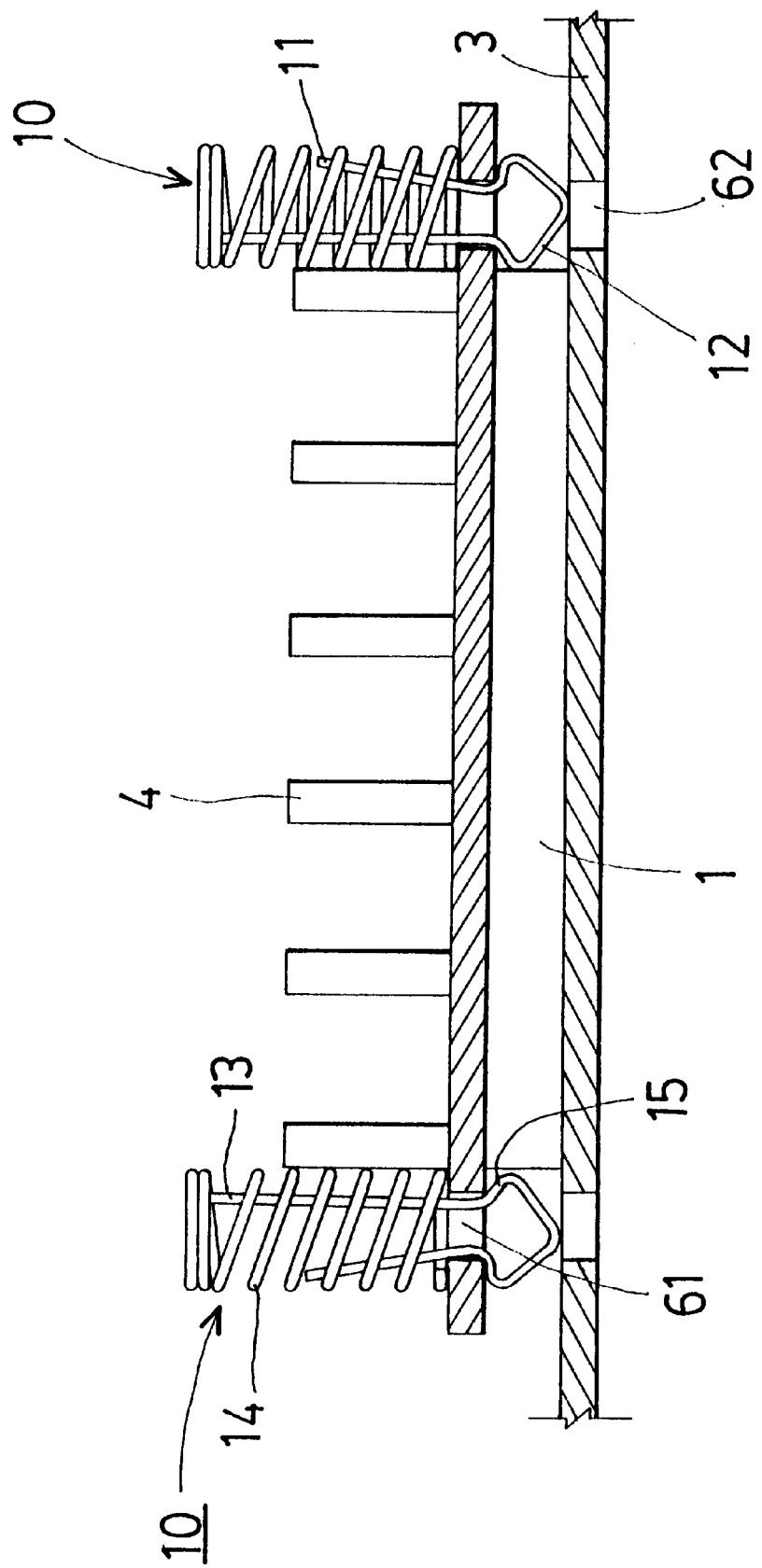
FIG. 11 is a sectional side view showing separation of the securing fixtures of the present invention from a PC board.

As shown in FIG. 10, the abovementioned action rod sections 13 is moved to get close to the movable rod section 11, and the insertion end 12 is slightly tilted. When the limiting portion 15 is pushed till its width is smaller than the inner diameter of the engaging hole 62, and by virtue that the spring section 14 is maintained in the compressed stated to be endued with an upward action force, hence the action force will pull upwardly the insertion end 12 to render the latter to automatically get rid of the engaging hole 62 of the PC board 3 and to move upwardly. The insertion end 12 thereby is moved back to the state being beneath the corresponding engaging hole 61 of the heat sink 4 (FIG. 11). In this way, connection of the heat sink 4 with the PC board 3 is relieved, and the heat sink 4 can be detached easily.

Figure 12:
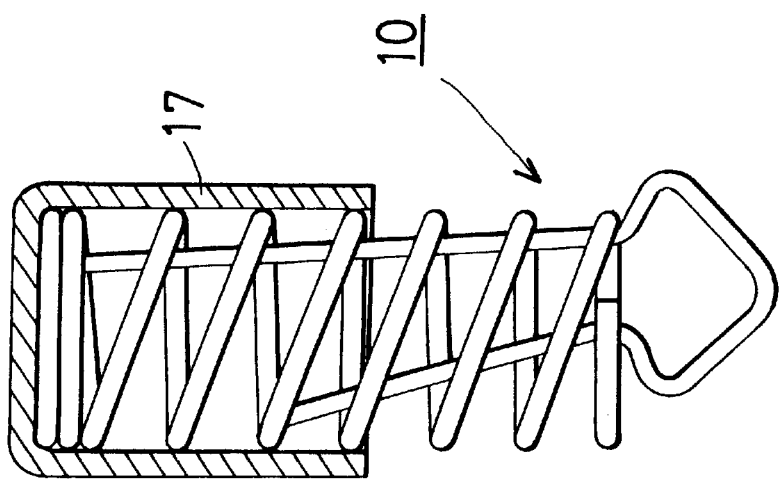
FIG. 12 is a schematic view showing a cap is added to a securing fixture of the present invention.
Figure 13:
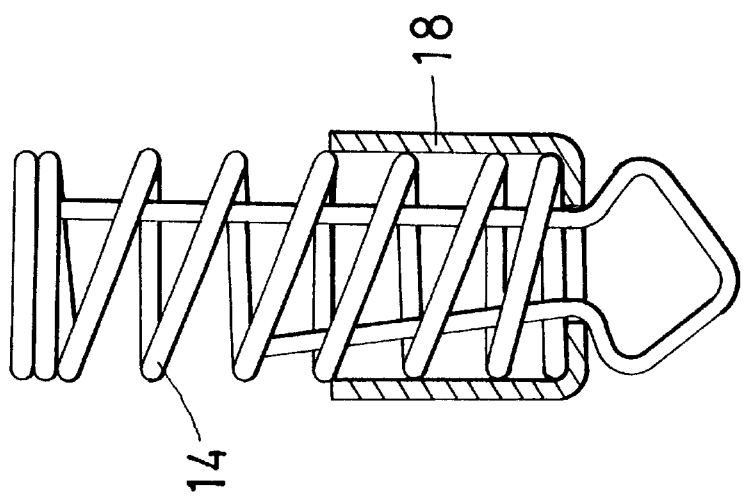
FIG. 13 is a schematic view showing a sleeve is added to a securing fixture of the present invention.

As shown in FIG. 12, when in practice the present invention, in order to get aesthetic appearance, the securing fixture 10 can be added on the top thereof with a cap 17, or can be added, as shown in FIG. 13, over the spring section 14 thereof with a sleeve 18. Various modifications or equivalent changes can be made to the elements of the present invention without departing from and fall within the scope of protection of this invention.

What is claimed is:

1. A securing fixture for a heat sink on a PC board, being integarally made from a metallic winding wire, said securing fixture is characterized by the structural body thereof;

said structural body is formed by extending a movable rod section downwardly and then bending it to form an insertion end which is wider on the upper portion and is narrower on the lower end thereof, and then by extending upwardly to form an action rod section of which the top is wound toward the lower end to form a spring section, said movable rod section and said action rod section are enveloped in said spring section, while said insertion end is at the bottom of said spring section; said insertion end is provided on the top thereof with a limiting portion with a width larger than the inner diameter of an engaging hole of said heat sink and an engaging hole of said PC board, said insertion end is engaged beneath said engaging hole of said PC board; while the external diameter of said spring section is larger than the inner diameter of said engaging hole of said heat sink, and said spring section is stopped above said engaging hole of said heat sink, for super imposition said heat sink on the top of a CPU that is fixed on said PC board.

2. A securing fixture for a heat sink on a PC board as in claim 1, wherein, said securing fixture further includes a cap attached to the top thereof.

3. A securing fixture for a heat sink on a PC board as in claim 1, wherein, said securing fixture further includes a sleeve disposed over said spring section.

* * * * *